US009418730B2

(12) United States Patent
Gotterba et al.

(10) Patent No.: US 9,418,730 B2
(45) Date of Patent: Aug. 16, 2016

(54) HANDSHAKING SENSE AMPLIFIER

(71) Applicant: Nvidia Corporation, Santa Clara, CA (US)

(72) Inventors: Andreas J. Gotterba, Santa Clara, CA (US); Jesse S. Wang, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/910,001

(22) Filed: Jun. 4, 2013

(65) Prior Publication Data

US 2014/0355334 A1    Dec. 4, 2014

(51) Int. Cl.

| G11C 11/00 | (2006.01) |
|---|---|
| G11C 11/419 | (2006.01) |
| G11C 7/10 | (2006.01) |
| G11C 11/413 | (2006.01) |
| G11C 11/412 | (2006.01) |
| G11C 7/08 | (2006.01) |
| G11C 7/22 | (2006.01) |

(52) U.S. Cl.
CPC .............. G11C 11/419 (2013.01); G11C 7/08 (2013.01); G11C 7/1006 (2013.01); G11C 7/1051 (2013.01); G11C 7/1072 (2013.01); G11C 7/1078 (2013.01); G11C 11/412 (2013.01); G11C 11/413 (2013.01); G11C 7/22 (2013.01)

(58) Field of Classification Search
CPC .. G11C 11/412; G11C 11/413; G11C 11/419; G11C 7/1051; G11C 7/22; G11C 7/1072; G11C 7/1006; G11C 7/1078
USPC ...................... 365/154, 189.15, 207
See application file for complete search history.

(56) References Cited

U.S. PATENT DOCUMENTS

| 3,178,590 | A | 4/1965 | Heilweil et al. |
|---|---|---|---|
| 3,241,122 | A | 3/1966 | Bardell |
| 3,381,232 | A | 4/1968 | Hoernes et al. |
| 3,413,557 | A | 11/1968 | Muhlenbruch et al. |
| 3,474,262 | A | 10/1969 | Turcotte |
| 6,304,505 | B1 | 10/2001 | Forbes et al. |
| 6,646,938 | B2 * | 11/2003 | Kodama ............... G11C 11/419 365/154 |
| 7,498,850 | B2 | 3/2009 | Hendrickson |
| 7,499,347 | B2 * | 3/2009 | Chen ........................ G11C 7/14 365/194 |
| 8,164,934 | B2 | 4/2012 | Watanabe et al. |
| 8,330,517 | B1 | 12/2012 | Cline |
| 8,369,177 | B2 | 2/2013 | Hold et al. |
| 8,570,818 | B2 * | 10/2013 | Jung ..................... G11C 7/1075 365/194 |
| 8,760,208 | B2 | 6/2014 | Dike et al. |
| 8,830,766 | B2 * | 9/2014 | Sahu ...................... G11C 7/065 365/189.05 |
| 2002/0089364 | A1 | 7/2002 | Goldgeisser et al. |
| 2003/0117170 | A1 | 6/2003 | Meneghini |
| 2005/0128844 | A1 | 6/2005 | Yamagami |
| 2007/0180006 | A1 | 8/2007 | Gyoten et al. |
| 2009/0168499 | A1 | 7/2009 | Kushida et al. |
| 2013/0129083 | A1 | 5/2013 | Fujino |
| 2014/0003160 | A1 | 1/2014 | Trivedi et al. |
| 2014/0354330 | A1 | 12/2014 | Gotterba et al. |
| 2014/0355362 | A1 | 12/2014 | Wang et al. |
| 2015/0016183 | A1 | 1/2015 | Sinangil et al. |

* cited by examiner

*Primary Examiner* — Pho M Luu

(57) ABSTRACT

Handshaking sense amplifier. In accordance with a first embodiment, an electronic circuit includes a sense amplifier configured to differentially sense contents of a memory cell. The circuit also includes a self-timing circuit configured to detect a completion of evaluation by the sense amplifier; and to initiate a subsequent memory operation responsive to the completion. A completion of evaluation may not be aligned with a clock edge.

20 Claims, 5 Drawing Sheets

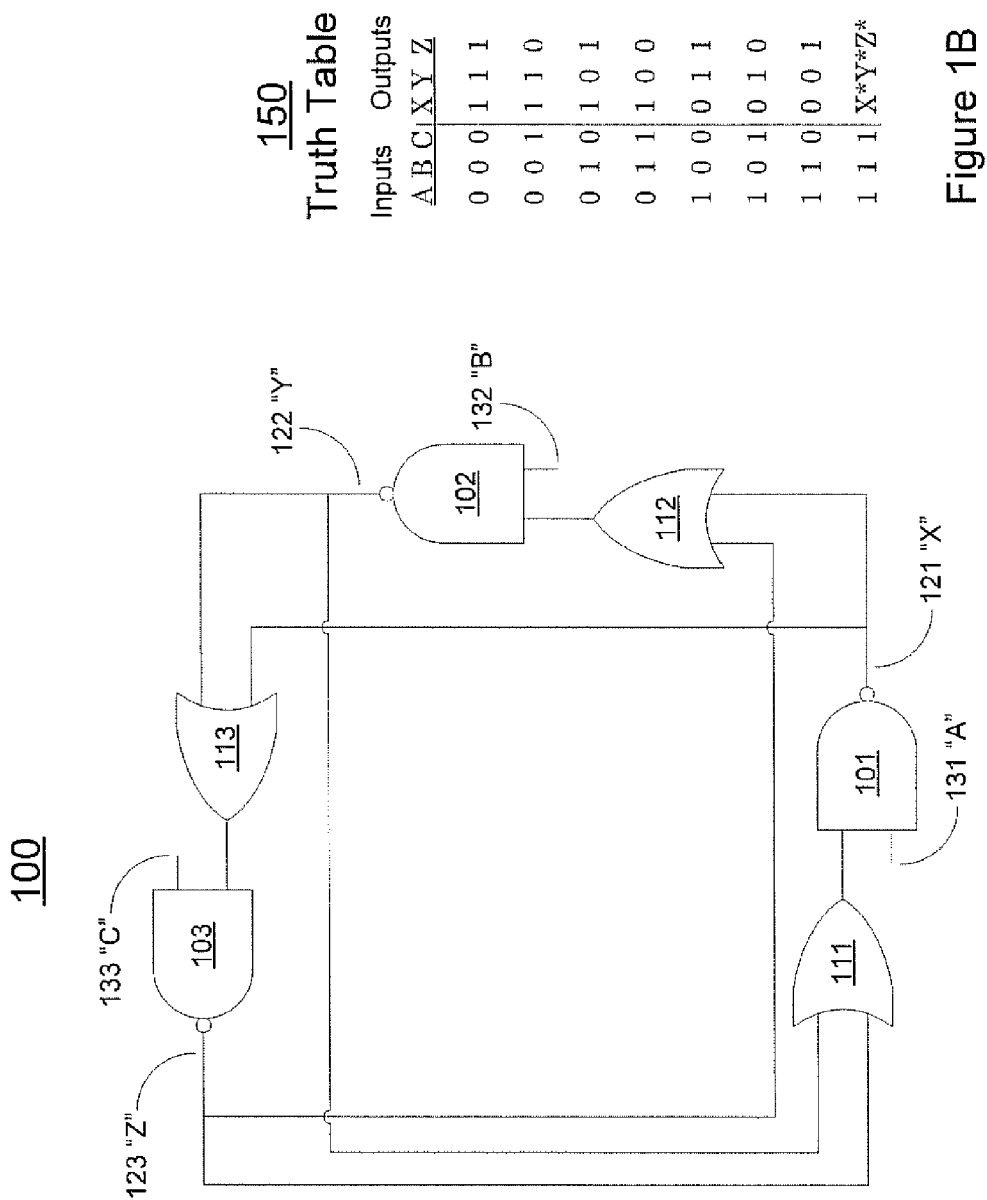

400

| CLK (251) | SEN (254) | SENB (255) | DONEB (256) | SENBL (257) | SENL (258) | SAE (252) | PCB (253) |
|---|---|---|---|---|---|---|---|
| 0 | 1 | 1 | 1 | 0 | 0 | 0 | 1 |
| 1 | 1 | 1 | 1 | 0 | 0 | 1 | 1 |
| 1 | 0 | 1 | 0 | 1 | 0 | 0 | 0 |
| 0 | 1 | 1 | 1 | 1 | 0 | 0 | 0 |
| 1 | 1 | 1 | 1 | 0 | 0 | 0 | 1 |
| 1 | 1 | 0 | 0 | 0 | 1 | 1 | 1 |
| 1 | 1 | 1 | 0 | 0 | 1 | 0 | 0 |
| 0 | 1 | 1 | 1 | 0 | 0 | 0 | 1 |

Operation

Figure 4

ABSTRACT

HANDSHAKING SENSE AMPLIFIER

RELATED APPLICATIONS

This application is related to co-pending, commonly owned U.S. patent application Ser. No. 13/909,981, filed Jun. 4, 2013, entitled "Three State Latch," to Gotterba and Wang and to US patent application Ser. No. 13/910,038, filed Jun. 4, 2013, entitled "Pipelined One Cycle Throughput for Single-Port 6T RAM," to Wang and Gotterba. Both applications are hereby incorporated herein by reference in their entireties for all purposes.

FIELD OF INVENTION

Embodiments of the present invention relate to the field of integrated circuit design and operation. More specifically, embodiments of the present invention relate to systems and methods for handshaking sense amplifiers.

BACKGROUND

A read access from a small signal, differential memory, e.g., a static random access memory (SRAM), generally comprises three operations. A first operation, known as or referred to as "development," applies a voltage differential on the sense nodes of a sense amplifier. A second operation, known as or referred to as "evaluate," amplifies a small voltage differential on the sense nodes into a full swing, e.g., "rail to rail," signal to determine the value of the memory cell. A third operation, known as or referred to as "pre-charge," charges the sense nodes so that they are ready for a subsequent access.

Often, under the conventional art, the development and evaluate operations are timed using a "replica," e.g., delay, circuit. A replica circuit generally comprises a bit line with the same load as the functional bit lines, with the circuit designed so that it always discharges. This replica can be in addition to, or instead of, a delay chain, e.g., of inverters. The replica is not used to store data; rather, it is used to track various delays of a memory circuit. Because the replica circuit is formed on the same die as the memory circuits, there is a degree of correspondence between the analog characteristics, e.g., capacitance, threshold voltage, static and dynamic leakage, switching rate and the like, of a replica and "real" memory circuits. For example, a replica circuit may track changes in operating conditions, e.g., Vdd and/or operating temperature, as well as global changes in process variation.

Unfortunately, the replica circuit and the real memory circuits are not identical. For example, a replica circuit generally does not track local process variations, e.g., statistical variations in dopant density, that may cause timing differences between a replica and "real" memory circuits, causing differences in behavior between them. Consequently, a replica timer is usually designed to be slower than a mirrored memory circuit. In addition, there is usually some variation among memory cells and sense amplifiers within a memory array. Accordingly, a replica timer must be designed to leave timing margin to allow for the slowest memory cells and sense amplifiers to complete their operations. The accumulation of timing margins to allow for worst case differences between replicas and actual memory, and to allow for the slowest memory cells and sense amplifiers, typically results in memory accesses, e.g., reads and/or writes, which occur slower than necessary, for most memory cells.

An alternative to a replica circuit is to use a separate clock phase for each operation, e.g., one phase for development, one phase for evaluate and one phase for precharge. Thus three clock phases, one and one half clock cycles, are required to complete all three operations. In addition, conventional-art phase-based designs typically add an extra clock phase to align the memory operations with the same clock phase, e.g., a rising edge. Accordingly, the conventional art typically utilizes four clock phases, two clock cycles, to complete the three operations, further slowing memory throughput under the conventional art.

SUMMARY OF THE INVENTION

Therefore, what is needed are systems and methods for handshaking sense amplifiers. What is additionally needed are systems and methods for handshaking sense amplifiers that detect the completion of an evaluate operation. A further need exists for systems and methods for handshaking sense amplifiers with improved timing. A still further need exists for systems and methods for handshaking sense amplifiers that are compatible and complementary with existing systems and methods of integrated circuit design, manufacturing and test. Embodiments of the present invention provide these advantages.

In accordance with a first embodiment of the present invention, an electronic circuit includes a sense amplifier configured to differentially sense contents of a memory cell. The circuit also includes a self-timing circuit configured to detect a completion of sensing by the sense amplifier; and to initiate a subsequent memory operation responsive to the completion. A completion of sensing may not be aligned with a clock edge.

In accordance with another embodiment of the present invention, an electronic circuit includes a pair of cross coupled inverters coupled to a sense node and to an inverted sense node. The circuit also includes a first pull up transistor coupled to the sense node, and a second pull up transistor coupled to the inverted sense node, and a bridge transistor configured to selectively couple the sense node to the inverted sense node. The gates of the first pull up transistor, the second pull up transistor and the bridge transistor are coupled together. The circuit further includes a sense amp enable transistor configured to selectively couple the pair of cross coupled inverters to ground for enabling the pair of cross coupled inverters, and a self-timing circuit coupled to the sense node and to the inverted sense node. The self-timing circuit is configured to detect a low level on either the sense node or the inverted sense node, and responsive to the detection to turn on the sense amp enable transistor.

In accordance with a method embodiment of the present invention, a method of performing a read operation on a small signal memory cell includes evaluating the sense node and the inverted sense node, precharging a sense node and an inverted sense node of the memory cell, and developing the sense node and the inverted sense node. A completion of the evaluating is determined by logic associated with a sense amplifier coupled to the sense node and the inverted sense node, and the precharging is initiated responsive to the completion.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 1A illustrates an exemplary three state latch, in accordance with embodiments of the present invention.

FIG. 1B illustrates an exemplary truth table for a three state latch, in accordance with embodiments of the present invention

FIG. 4 illustrates a state table for a handshaking sense amplifier, in accordance with embodiments of the present invention.

DETAILED DESCRIPTION

Figure 1C:
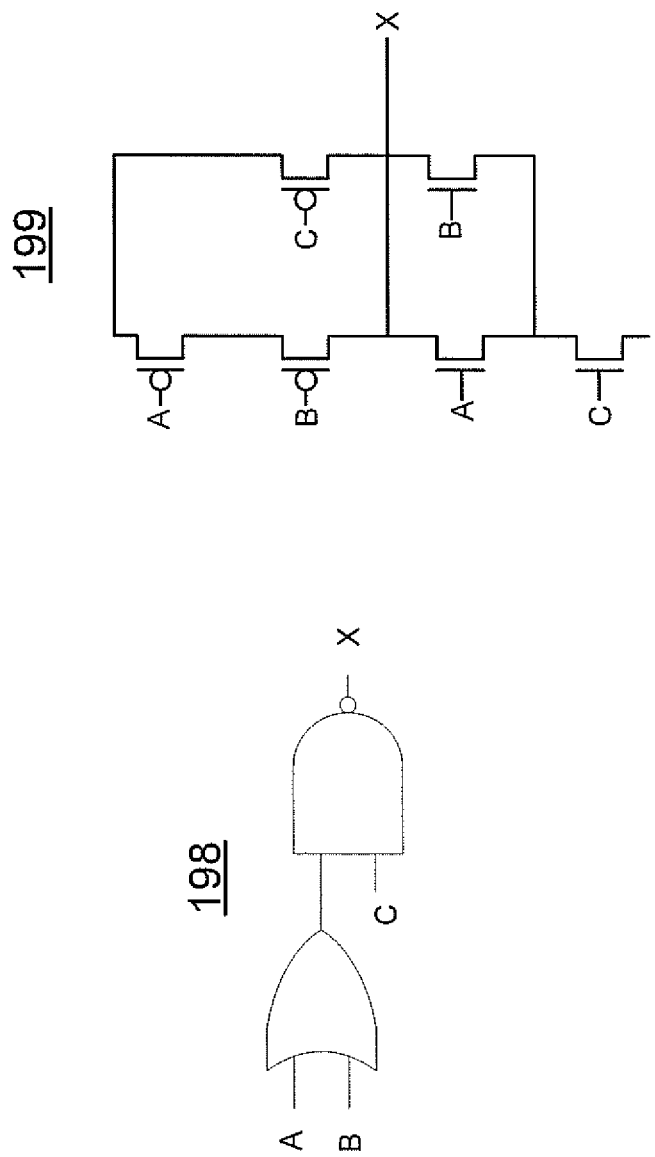
FIG. 1C illustrates a logical equivalence between a combination of OR and NAND gates and an OAI gate.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

HANDSHAKING SENSE AMPLIFIER

It is to be appreciated that the term "three state" as used herein does not refer to, and is not analogous to the term "Tri-state®," a registered trademark of Texas Instruments, Inc., of Dallas, Tex. As is known to those of skill in the art, a Tri-state® device includes conventional "high" and "low" outputs, as well as a high impedance, or "hi-Z," output state. Embodiments in accordance with the present invention store three (or more) states in a single latch.

FIG. 1A illustrates an exemplary three state latch 100, in accordance with embodiments of the present invention. Three state latch 100 comprises three inputs, 131 A, 132 B and 133 C, and three outputs, 121 X, 122 Y and 123 Z. Three state latch 100 comprises three two-input NAND gates 101, 102 and 103, and three two-input OR gates, 111, 112 and 113.

FIG. 1B illustrates an exemplary truth table 150 for three state latch 100 of FIG. 1A, in accordance with embodiments of the present invention. Setting input 131 A, 132 B or 133 C to zero forces the corresponding output 121 X, 122 Y or 123 Z to one. For example, setting input 133 C to zero forces output 123 Z to one. Similarly, setting an input to one forces the corresponding output to zero if any other input is zero.

If all inputs 131 A, 132 B and 133 C are set to one, then the output of latch 100 will retain the state it had last, as indicated by the last row of truth table 150. The "star" notation, e.g., "X*," indicates previous state of the output signal line. For example, if inputs 131 A and 132 B are set to one, and input 133 C is set to zero, outputs 121 X and 122 Y will be zero, and output 123 Z will be set to one. Changing input 133 C from zero to one will result in all inputs set to one, and the outputs will retain their previous state. In this example, outputs 121 X and 122 Y will be zero, and output 123 Z will be set to one. In accordance with embodiments of the present invention, which ever input is the last to transition from zero to one will have its output remain one.

It is appreciated that embodiments in accordance with the present invention offer several advantages in comparison to a three state circuit based on multiple conventional, e.g., two-state, latches. For example, there are no transitory states. In addition, embodiments in accordance with the present invention may operate asynchronously, e.g., with unclocked handshaking signals. Further, further, embodiments in accordance with the present invention generally require fewer gates, less die area and are thus less expensive in comparison to the conventional art. Still further, embodiments in accordance with the present invention will generally operate faster, e.g., with fewer gate delays, than under the conventional art. For example, in accordance with embodiments of the present invention, the worst case delay from input to output is two gate delays.

It is appreciated that three state latch 100 (FIG. 1) may be constructed from instances of an "OR-AND-INVERT" ("OAI") gate structure, which is logically (but not physically) equivalent to the illustrated pairs of cascaded gates. For example, symbolic gates 111 and 101 together represent an OR gate 111, followed by an AND gate followed by inversion, e.g., NAND gate 101. In accordance with embodiments of the present invention, a three state latch may be formed from an "AND-OR-INVERT" ("AOI") gate structure, with inversion of the truth table. Such embodiments are considered within the scope of the present invention.

Latch 100 of FIG. 1A is presented schematically as a logical combination of OR and NAND gates. Each pair of OR and NAND gates may be rendered as a single OR-AND-Invert (OAI) gate with an equivalent logical function. FIG. 1C illustrates a logical equivalence between a combination of OR and NAND gates 198, e.g., as illustrated in FIG. 1A, and an OAI gate 199. While logically equivalent, e.g., gates 198 and gate 199 have the same truth table, it is appreciated that there are physical differences between two separate, cascaded gates as illustrated in 198 and a single OAI gate 199. For example, OAI gate 199 will generally comprise fewer transistors, less die area, and operate faster and at less power consumption, in comparison to the 198 structure. For example, OAI gate 199 produces an output in a single gate delay, whereas gates 198 may generally be expected to require two gate delays to propagate a signal.

Accordingly, embodiments in accordance with the present invention may utilize an OAI gate structure, e.g., OAI gate 199, or an AOI gate structure. However, the schematic representations presented herein illustrate the logical function of the separate gates. For example, all inputs of OAI gate 199 do not have the same logical function, and hence schematics utilizing the logical function of the separate gates represent a preferred approach to illustrate aspects of the present invention. With reference to FIG. 1C, inputs A and B are referred to as OR inputs of the OAI gate 199, and its schematic equivalent 198. Input C is referred to as a NAND input.

In addition, in accordance with embodiments of the present invention, latches with an arbitrary number of inputs may be formed by "widening" the first part of the gate, e.g., the OR gate in the exemplary OAI gate structure. For example, to form a four-input latch, the OR gates of FIG. 1A should be changed to be three input gates.

As illustrated in three state latch 100 of FIG. 1A, all outputs are cross coupled to logic accepting the other inputs. For example, with respect to four state latch 100 of FIG. 1A, output 121 X is coupled to OR gate 112, a part of the logic accepting input 132 B, and is coupled to OR gate 113, a part of the logic accepting input 133 C. Accordingly, the first gate of each stage should have inputs for the number of states (stages) minus one.

Figure 2:
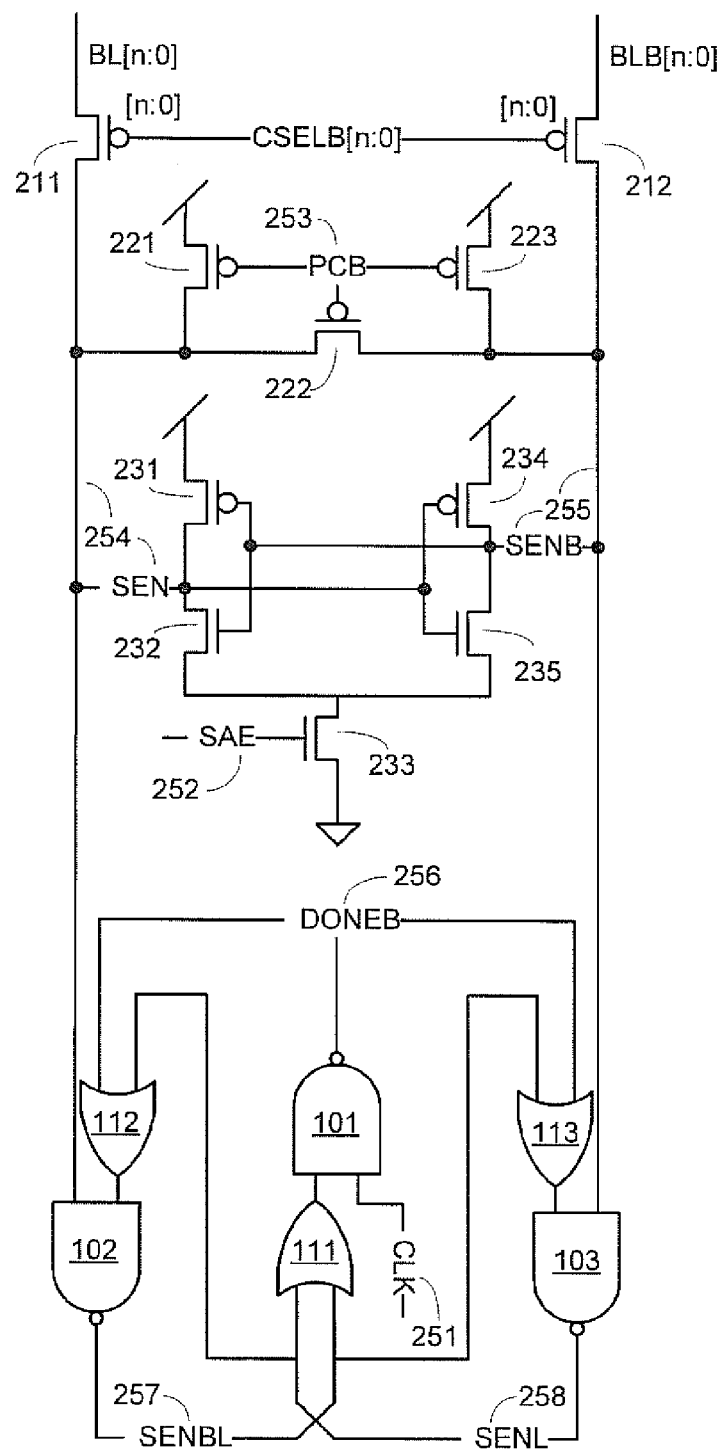
FIG. 2 illustrates an exemplary handshaking sense amplifier electronic circuit, in accordance with embodiments of the present invention.

FIG. 2 illustrates an exemplary handshaking sense amplifier electronic circuit 200, in accordance with embodiments of the present invention. Handshaking sense amplifier electronic circuit 200 comprises P-type metal oxide semiconductor (PMOS) devices 211 and 212 for selectively coupling a bit line to sense node SEN 254 and for selectively coupling an inverted bit line to sense node inverted SENB 255, respectively. When column select inverted, CSELB[n:0], is low, the bit line and inverted bit line are coupled to the sense nodes. (It is appreciated that only one of the CSELB[n:0] signals will go low at a time.) This happens during a development operation, so that the sense nodes are developed along with the bit lines. It is appreciated that bit line precharge occurs separately from sense node precharge and is controlled by a separate mechanism, not illustrated herein.

In addition, handshaking sense amplifier electronic circuit 200 comprises three P-type metal oxide semiconductor (PMOS) devices for precharging sense nodes SEN 254 and SENB 255. Responsive to a signal 253 "precharge bar" (inverted precharge), PMOS device 222 couples the sense node SEN 254 and the inverted sense node SENB 255. Responsive to the same precharge 253 signal, PMOS devices 221 and 223 pull the sense node and the inverted sense node high, to precharge the sense nodes.

Handshaking sense amplifier electronic circuit 200 also comprises a pair of cross coupled inverters configured to function as a sense amplifier. A first inverter, comprising PMOS device 231 and NMOS device 232 accepts a "sense bar" SENB 255 signal as input. A second inverter, comprising PMOS device 234 and NMOS device 235 accepts a "sense" SEN 254 signal as input. NMOS device 233 functions as an enable device for the sense amplifier, responsive to a "sense amplifier enable" SAE signal 252.

Handshaking sense amplifier electronic circuit 200 further comprises a three state latch, e.g., three state latch 100 as previously described with respect to FIG. 1A. It is to be appreciated that the generic inputs, e.g., "A," "B" and "C," and the generic outputs, e.g., "X," "Y" and "Z," referred to in FIG. 1A are relabeled with names more meaningful to a memory circuit, although the basic function has not changed. For example, the "A" input is used to input a synchronizing clock signal CLK 251. The "B" input is used for the sense, SEN 254, signal. The "C" input is used for the SENB 255 signal. Similarly, the "X" output produces the DONEB 256 signal. The "Y" output produces the SENBL 257 output signal, and the "Z" output produces the SENL 258 output signal.

In accordance with embodiments of the present invention, use of the novel three state latch enables an "unset" state that the latch enters during the evaluate operation. The three state latch will stay in "unset" until evaluate finishes, and the latch is in either of the "set to zero" or "set to one" states. This allows the evaluate state to be self timed by a handshake. Development keeps an entire phase of the clock, while evaluate and precharge share the other phase.

Synchronizing clock signal, CLK 251, is a periodic clock signal. Sense amplifier enable, SAE 252 is the logical AND of DONEB 256 and CLK 251. Precharge bar is the logical OR of DONEB 256 and the inverse of CLK 251. The done inverted signal, DONEB 256, is the logical OR of the inverse of CLK 251 with the logical AND of sense latched inverted, not (SENL 258) with the inverse of sense bar latched inverted, not(SENBL 257). The sense bar latched inverted, SENBL 257, signal is the logical OR of sense inverted, not(SEN 254) with the logical AND of inverted done inverted, not(DONEB 256) with sense latched inverted, not(SENL 258). The sense bar latched, SENBL 258, signal is the logical OR of inverted sense inverted, not(SENB 255), with the logical AND of inverted done inverted, not(DONEB 256), with inverted sense bar latched inverted, not(SENBL 257).

Figure 3:
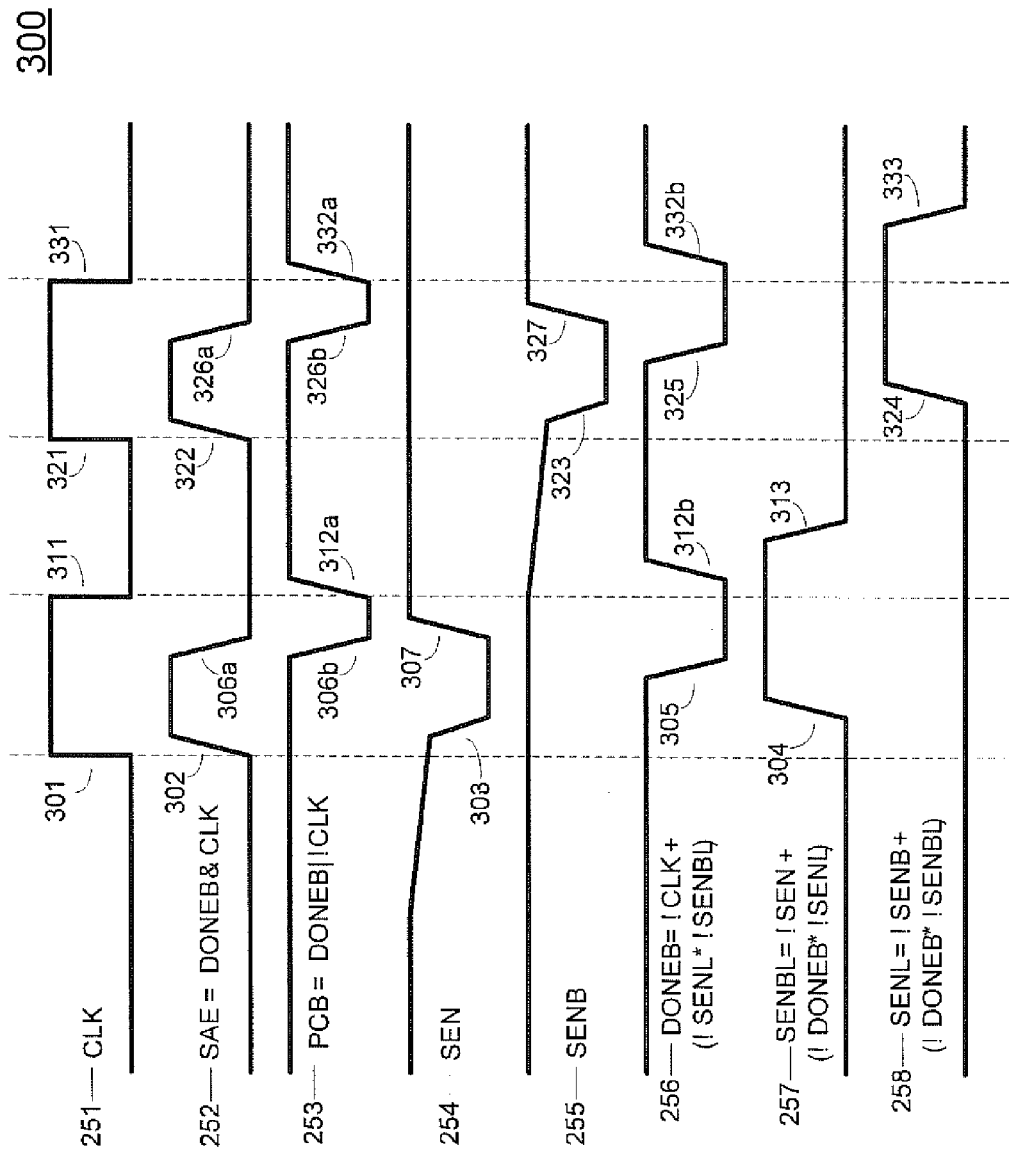
FIG. 3 illustrates an exemplary timing diagram for operation of handshaking sense amplifier electronic circuit, in accordance with embodiments of the present invention.

FIG. 3 illustrates an exemplary timing diagram 300 for operation of handshaking sense amplifier electronic circuit 200 (FIG. 2), in accordance with embodiments of the present invention.

Timing diagram 300 illustrates the timing relationship among a synchronizing clock signal, CLK 251, sense node enable, SAE 252, precharge inverted (bar), PCB 253, sense enable, SEN 254, sense inverted (bar) SENB 255, done inverted (bar), DONEB 256, sense bar latched(bar), SENBL 257, and sense latched, SENL 258.

SAE 252 and PCB 253 depend on CLK 251 and DONEB 256. All signals depend on CLK 251, with the set and reset of SAE 252 both coming from the rising edge of CLK 251. SAE 252 sets immediately after CLK 251 rise, and does not reset until DONEB 256 goes low (which indicates that the latch has been set).

Edges 302, 303, 304, 305, 306a, 306b and 307 are generated off of the rising edge 301 of CLK 251. The "a" and "b" notation, e.g., of edges 306a and 306b, indicate that these edges occur substantially in parallel. Edges 312a, 312b and 313 are generated off of the falling edge 311 of CLK 251.

Edges 322, 323, 324, 325, 326a, 326b and 327 are generated off of the rising edge 321 of CLK 251. Edges 332a, 332b and 333 are generated off of the falling edge 331 of CLK 251.

FIG. 4 illustrates a state table 400 for a handshaking sense amplifier 200, in accordance with embodiments of the present invention. It is appreciated that the first six columns of state table 400 derive from truth table 150 (FIG. 1B), with the aforementioned label substitutions, although not all input combinations are present.

It is appreciated that when CLK 251 has a rising edge, all inputs to the three state latch, e.g., CLK 251, SEN 254 and SENB 255, are one and the three state latch retains its last state. The development operation occurs while CLK 251 is low. The evaluate and precharge operations take place while CLK 251 is high.

For example, with respect to FIG. 3, responsive to the rising edge 301 of CLK 251, the sense amplifier is enabled (SAE 252, edge 302). When a low is detected on either sense line, SEN 254 or SENB 255, the DONEB 256 handshake line is triggered. Responsive to the DONEB 256 edge 305, the cell value is read, e.g., in an evaluate operation. The sense amplifier is turned off (edge 306a) and precharging is turned on (edge 306b). Development begins with the falling edge 311 of CLK 251. During development, precharge (PCB 253) is off. A subsequent evaluate cycle is available on the next rising edge 321 of CLK 251.

In accordance with embodiments of the present invention, the timing of the handshaking sense amplifier is based on a clock signal, CLK 251, and a handshake signal, DONEB 256. It is appreciated that the self-timing handshake signal DONEB 256 will generally occur prior to a subsequent phase of CLK 251. In contrast, absent such a handshake signal, the conventional art typically would require at least one clock phase for each of the three operations of development, evaluate and precharge. For example, the conventional art typically requires one phase for each operation, e.g., one phase for development, one phase for evaluate and one phase for precharge. Thus three clock phases, one and one half clock cycles, are required to complete all three operations. In addition, prior-art phase based designs typically add an extra clock phase to align the memory operations with the same clock phase, e.g., a rising edge. Accordingly, the conventional art typically utilizes four clock phases, two clock cycles, to complete the three operations. In contrast, embodiments in accordance with the present invention are able to complete the three operations of development, evaluate and precharge in a single clock cycle.

Accordingly, fewer clock cycles and less timing margin are required in comparison to a conventional art, replica-based design. During an evaluation of the integrated circuit design, the frequency of each integrated circuit may be increased until the circuit fails, in order to determine an operating frequency. Moreover, there is no need to reprogram a replica timer in order to adjust a speed of memory operations, as may be the case under the conventional art.

In addition, each sense amplifier may find its own tradeoff between evaluate and precharge timings. If reading a weak cell, evaluate may take longer, but that time may be "borrowed" from a precharge time. For example, the operating frequency is limited only in a case in which the sense evaluate has both weak evaluate (due to the cell being read or the sense evaluate itself) and weak precharge. Without requiring such extra timing margin, a higher performance design may be enabled by embodiments in accordance with the present invention.

It is to be further appreciated that embodiments in accordance with the present invention have less requirement for a 50% duty cycle clock signal in comparison to the conventional art. For example, few state changes take place during a low phase of CLK 251, and such state changes are triggered off the falling edge 311 of CLK 251. As is known to those of ordinary skill in the art, it is difficult to obtain a 50% duty cycle clock signal, and it is additionally difficult to propagate and distribute such a clock signal across an integrated circuit. Accordingly, embodiments in accordance with the present invention are more tolerant of duty cycles that are not close to 50%, and more tolerant of duty cycle degradation in distribution, in comparison to the conventional art.

Embodiments in accordance with the present invention provide systems and methods for handshaking sense amplifiers. In addition, embodiments in accordance with the present invention provide systems and methods for handshaking sense amplifiers that detect the completion of an evaluate operation. Further, embodiments in accordance with the present invention provide systems and methods for handshaking sense amplifiers with improved timing. Still further, embodiments in accordance with the present invention provide systems and methods for handshaking sense amplifiers that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An electronic circuit comprising:
a sense amplifier configured to differentially sense contents of a memory cell;
a self-timing circuit configured to detect a completion of evaluation by said sense amplifier; and
said self-timing circuit also configured to initiate a subsequent memory operation responsive to said completion.

2. The electronic circuit of claim 1 wherein said completion of evaluation is not aligned with a clock edge.

3. The electronic circuit of claim 1 wherein initiation of said subsequent memory operation is not aligned with a clock edge.

4. The electronic circuit of claim 1 wherein said subsequent memory operation is a precharge operation.

5. The electronic circuit of claim 1 wherein said memory cell is a SRAM cell.

6. The electronic circuit of claim 1 further comprising a precharge circuit to precharge a sense node.

7. The electronic circuit of claim 1 wherein said self-timing circuit comprises a three state latch.

8. An electronic circuit comprising:
a pair of cross coupled inverters coupled to a sense node and an inverted sense node;
a first pull up transistor coupled to said sense node;
a second pull up transistor coupled to said inverted sense node;
a bridge transistor configured to selectively couple said sense node to said inverted sense node;
wherein the gates of said first pull up transistor, said second pull up transistor and said bridge transistor are coupled together;
a sense amp enable transistor configured to selectively couple said pair of cross coupled inverters to ground for enabling said pair of cross coupled inverters;
a self-timing circuit coupled to said sense node and to said inverted sense node, said self-timing circuit configured to detect a low level on either said sense node or said inverted sense node, and responsive to said detection to turn on said sense amp enable transistor.

9. The electronic circuit of claim 8 wherein said self-timing circuit is further configured to turn on said first pull up transistor, said second pull up transistor and said bridge transistor responsive to said detection.

10. The electronic circuit of claim 9 comprising:
a single latch circuit comprising:
first, second and third pairs of two-input OR gates having an output coupled to an input of a two-input NAND gate;
the output of the first NAND gate coupled to an input of the second and third OR gates;
the output of the second NAND gate coupled to an input of the first and third OR gates; and
the output of the third NAND gate coupled to an input of the second and first OR gates.

11. The electronic circuit of claim 10 further comprising:
an input of said first OR gate coupled to said sense node; and
an input of said third OR gate coupled to said inverted sense node.

12. The electronic circuit of claim 11 further comprising:
the output of said second NAND gate coupled to logic to control said first pull up transistor, said second pull up transistor and said bridge transistor.

13. The electronic circuit of claim 12 further comprising:
the output of said second NAND gate coupled to logic to control said sense amp enable transistor.

14. The electronic circuit of claim 12 further comprising:
an input of said second OR gate coupled to a periodic clock signal.

15. A method of performing a read operation on a small signal memory cell, said method comprising:
evaluating said sense node and said inverted sense node;
precharging a sense node and an inverted sense node of said memory cell;
developing said sense node and said inverted sense node, wherein a completion of said evaluating is determined by logic associated with a sense amplifier coupled to said sense node and said inverted sense node, and said precharging is initiated responsive to said completion.

16. The method of claim 15 wherein said precharging is responsive to said completion and a high edge of a synchronizing clock.

17. The method of claim 16 wherein said precharging is initiated prior to an edge of said synchronizing clock subsequent to said evaluating.

18. The method of claim 15 wherein said completion of said evaluating is not substantially aligned with an edge of a synchronizing clock signal.

19. The method of claim 15 wherein said evaluating, said precharging and said developing take place within one cycle of a synchronizing clock signal.

20. The method of claim 15 wherein said logic associated with a sense amplifier comprises a three state latch.

* * * * *